(12) United States Patent
Tsai et al.

(10) Patent No.: US 6,410,446 B1
(45) Date of Patent: Jun. 25, 2002

(54) METHOD FOR GAP FILLING

(75) Inventors: Cheng-Yuan Tsai, Yunlin Hsien; Chih-Chien Liu, Taipei; Ming-Sheng Yang, Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/531,974

(22) Filed: Mar. 20, 2000

(30) Foreign Application Priority Data

Feb. 14, 2000 (TW) ........................... 089102402 A

(51) Int. Cl.$^7$ ............................................. H01L 21/31
(52) U.S. Cl. ....................................................... 438/695
(58) Field of Search ........................... 117/84, 93, 102; 438/694, 695

(56) References Cited

U.S. PATENT DOCUMENTS

| | | | |
|---|---|---|---|
| 5,968,610 A | * 10/1999 | Liu et al. | 427/579 |
| 6,030,881 A | * 2/2000 | Papasouliotis et al. | 438/424 |
| 6,043,152 A | * 3/2000 | Chang et al. | 438/680 |
| 6,048,775 A | * 4/2000 | Yao et al. | 438/427 |
| 6,174,808 B1 | * 1/2001 | Jang et al. | 438/680 |
| 6,200,911 B1 | * 3/2001 | Narwankar et al. | 438/758 |
| 6,203,863 B1 | * 3/2001 | Liu et al. | 427/579 |
| 6,218,284 B1 | * 4/2001 | Liu et al. | 438/624 |
| 6,251,795 B1 | * 6/2001 | Shan et al. | 438/723 |

* cited by examiner

*Primary Examiner*—Benjamin L. Utech
*Assistant Examiner*—Matthew Anderson
(74) *Attorney, Agent, or Firm*—J. C. Patents

(57) ABSTRACT

A method of filling a gap is proposed. The method of the invention is applied on a substrate which has conductive structures formed thereon. A HDPCVD is performed to form a dielectric layer on the substrate. The HDPCVD process comprises multi-steps. In a first step, a gas source is added to a deposition chamber to form dielectric material over the substrate. The gas source comprises reactive gas and inert gas. Thus, the first step can simultaneously perform deposition and sputtering. In a second step, the reactive gas is driven out of the deposition chamber. Only sputtering is used to remove a part of the dielectric material at top corners of the conductive structures. In a third step, the reactive gas is again added into the deposition chamber to deposit the dielectric material until filling the gap.

10 Claims, 2 Drawing Sheets

METHOD FOR GAP FILLING

CROSS-REFERENCE TO RELATED APPLICATION

This application claims the priority benefit of Taiwan application serial no. 89102402, filed Feb. 14, 2000.

BACKGROUND OF THE INVENTION

1. Field of the Invention

The invention relates to a method of a multi-step high plasma chemical vapor deposition (HDPCVD), and more particularly to a method of filling a gap between conductive structures in a semiconductor device with dielectric material.

2. Description of the Related Art

In semiconductor devices, multilevel conductive wiring and other conductors are normally isolated by inter-metal dielectric (IMD) layers. As the dimensions of devices shrink, the aspect ratio of the gap between conductive layers is getting higher A gap with a higher aspect ratio is more difficult to fill. On the other hand, as the distance between conductive layers and other conductors becomes shorter, the capacitance increases, so that the operating speed would be affected. To achieve a higher efficiency with the shrinking dimension of devices, the dielectric layers between conductive layers are required to have characteristics such as even and uniform gap-filling, preventing water absorption, and minimizing capacitance between conductive layers by using a lower dielectric constant material.

Thus, it is important to deposit a high quality, interstice-free dielectric layer at high aspect ratio conditions. The dielectric layer is formed, for example by CVD which is performed by introducing the precursor to the deposition surface, and then, after reaction, depositing the material on the surface. Different kinds of CVD processes are in use, such as atmospheric pressure CVD (APCVD), low pressure CVD (LPCVD), and plasma enhanced CVD (PECVD). To obtain high quality oxide by APCVD and LPCVD, a higher deposition temperature such as about 650° C. to 850° C. is required. However, for some conductive material, for example, aluminum, such a high deposition temperature causes voids within the oxide. As a result, a layer containing voids is of certainly not acceptance for using at IMD layer. By PECVD, plasma provides extra energy for activating reacting gases, and therefore, the deposition is performed at a lower temperature, for example, a temperature at about 400° C. or lower.

In a conventional method of forming a dielectric layer between conductive wiring, an interlayer is formed by PECVD using silane or tetra-ethyl-ortho-silicate (TEOS) as precursor. An accompanying spin-on-glass (SOG) layer is formed on the conductive wiring and to fill the gap therebetween. However, due to its water-absorbing and interstice—forming natures, the SOG layer cannot entirely fit all the key requirements. This phenomenon is even more obvious as the devices become smaller. Thus, a method to fill the gap with a high quality dielectric material is urgently in need of development.

In addition, in a device with a smaller dimension, the conventional CVD cannot well fill in the gap at a higher aspect ratio. For example, using conventional PECVD, interstices between conductive wiring are always found due to the fact that higher arriving angle at corner given rise to a sealed at top corner. In the subsequent process, these interstices are possibly open and contaminated. Therefore, the conductive wiring or the contact is easily damaged, and the device is degraded.

FIG. 1A and FIG. 1B illustrate a method of filling a gap by a conventional PECVD process. Shown in FIG. 1A, an oxide layer 10 is formed on a substrate 12 by PECVD with TEOS as a precursor. On an upper part of the sidewall of the conductive wiring 14, an overhang 15 is formed. As the deposition continues, an interstice 16 is sealed as shown in FIG. 1B. The interstice 16 is formed as a seam, lengthwise along the conductive wiring. The seam is near the end of the conductive wiring, or is restricted in the bending part of the conductive wiring. In the subsequent process, the interstice 16 is very likely to be uncovered, so that a chemical for polishing or an etching by-product is trapped by the interstice. The trapped material within the interstice is very difficult to remove, and thus, the yield of the subsequent process is degraded.

Recently, a conventional method with a high gap-filling ability for depositing dielectric material within wiring lines is high-density plasma CVD (HDPCVD). The method comprises deposition and sputtering components to obtain a good gap-filling capability. However, decreasing distance between the wiring lines when devices continually scale down, dielectric layer deposited on the wiring lines may be sputtered away due to the sputtering component of the HDPCVD process. This sputtered dielectric material would redeposit on the opposite wiring lines so that overhang is formed which degrade the gap-filling capability of HDPCVD process thereafter, as shown in FIG. 1C. Dielectric material 17 deposited on the top of the wiring lines 14 is sputtered and redeposited from one side to another side of the wiring lines 14.

SUMMARY OF THE INVENTION

The invention provides a method of gap filling that uses HDPCVD. The process includes different steps to control and to adjust deposition/sputtering ratio. Dielectric material can be formed within a gap without an overhang at corners of the top of the gap.

The method of the invention is applied on a substrate which has conductive structures formed thereon. A HDPCVD process is performed to form a dielectric layer on the substrate. The HDPCVD process consists of multi-steps. First, a gas source is diverted to a deposition chamber for forming dielectric material over the substrate. The gas source both comprises reactive gas and inert gas, such as argon. Thus, the first step can simultaneously have depositing and sputtering. Second, the reactive gas is driven out of the deposition chamber. Only sputtering agent from inert gas, such as argon, or from oxygen is used to remove a part of the dielectric material at top corners of the conductive structures and to redeposit the removed dielectric material on the bottom of the gap between the conductive structures. Third, the addition of the reactive gas into the deposition chamber is resumed to deposit the dielectric material until the gap is completely filled.

The multi-step HDPCVD process is performed without interruption. Bias power plasma is turned on, and the gas source flows consecutively. The reactive gas flows is diverted from a chamber for several seconds to provide an in-situ sputtering treatment on the deposited dielectric material. The supply of the reactive gas is continuously flowing into system so that time spent turning the supply on/off can be saved.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

The HDPCVD process has been intensively developed due to the following characteristics. The HDPCVD process is performed at a lower deposition temperature compared to other CVD processes. For example, in a commercial application by Novellus System, Inc, HDPCVD has been applied to form a high quality density, waterproof, and planarized dielectric layer. In a HDPCVD system, a high density plasma is supplied from different sources, for example, electron cyclotron resonance (ECR), inductively coupled plasma (ICP), or transformer coupled plasma. During the deposition, the plasma produced by any mechanism is controlled by the bias sputtered component. In terms of the bias power which dominates the sputtering and deposition which corresponds to controlling by gases and/or the RF frequency source, plasma ratio frequency source, the ratio of sputter and deposition can be altered. By precisely controlling the above parameters, it is possible to fill the gap more effectively without forming interstices. Moreover, in other deposition process such as PECVD, overhang is formed on the upper sidewall of the gap. Overhang formation causes the formation of seams or voids within the dielectric layer. By HDPCVD, an etching or sputtering process is provided during deposition to remove the overhang. Thus, the possibility of forming interstices or voids is reduced.

Figure 1A:
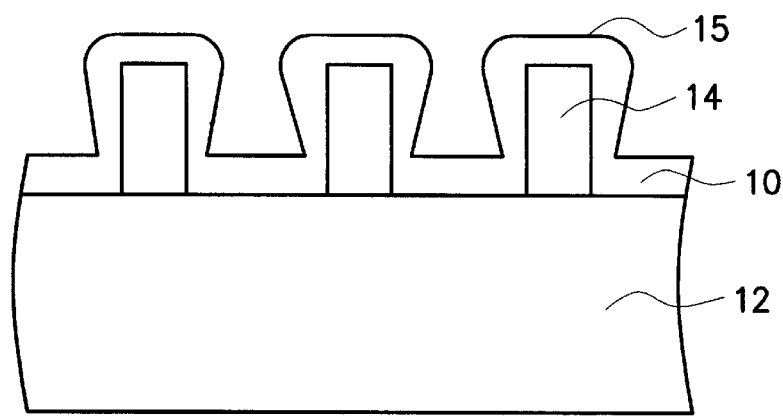
FIG. 1A and FIG. 1B illustrate a method of filling a gap by a conventional PECVD process.
Figure 1B:
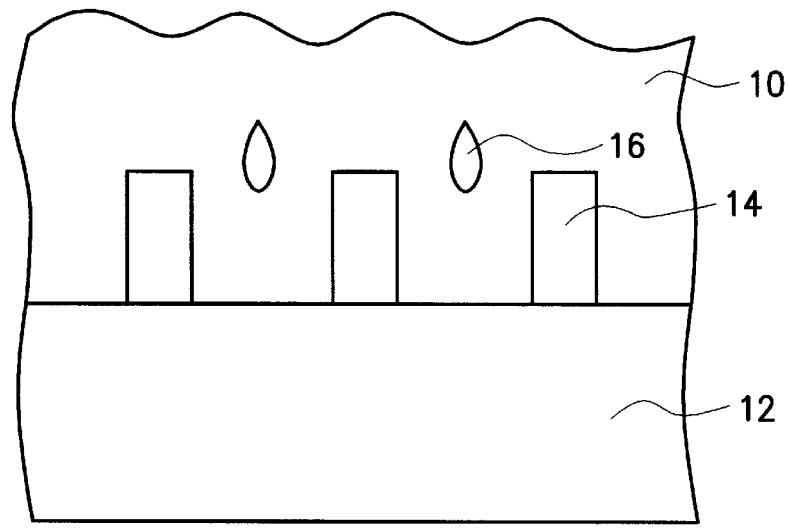
Figure 1C:
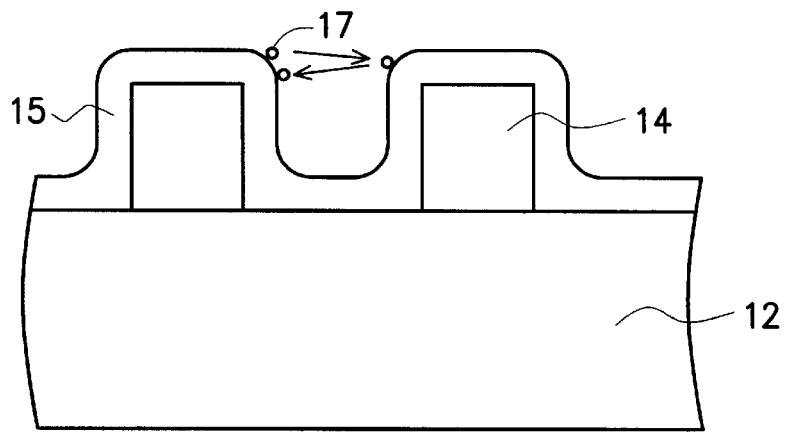
FIG. 1C illustrate overhang structure formed from a conventional HDPCVD.
Figure 2A:
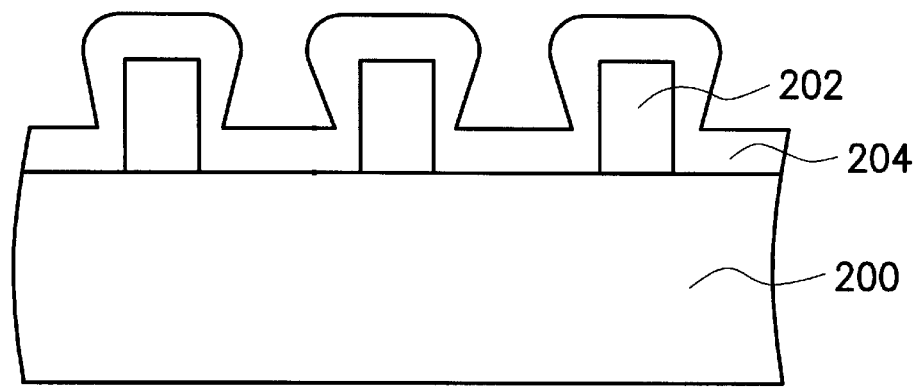
FIGS. 2A, 2B, 2C are cross-sectional views illustrating the process steps of one preferred embodiment of the method of filling gap.
Figure 2B:
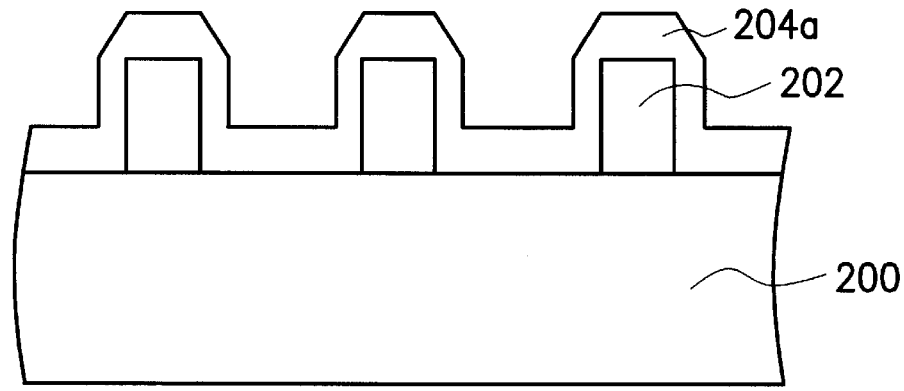
Figure 2C:
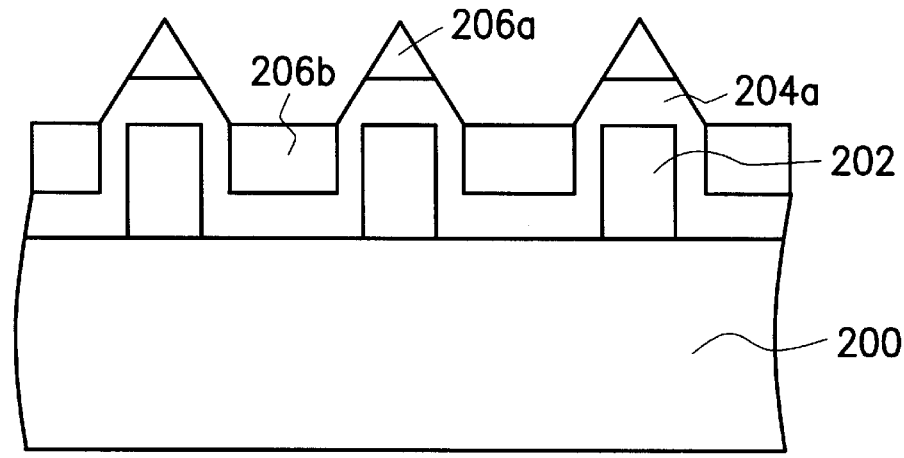

FIGS. 2A to 2C are cross-sectional views illustrating the process steps of one preferred embodiment of the method of filling a gap.

Referring to FIG. 2A, a substrate 200 is provided. The substrate 200 may have conductive structures or an insulating layer formed thereon. The structure on the substrate 200 is indicated by reference number 202. The conductive structures formed on the substrate 200 are isolated by dielectric material. The insulating layer has gaps for vias or for trenches formed therein. In the structure shown in FIG. 2A, conductive structures 202 are formed on the substrate 200. The conductive structures 202 can be formed by different kinds of material, including aluminum, alloy of aluminum and silicon, alloy of aluminum and copper, copper, alloy comprising copper and other multi-layer structures, and other multi-layer structures comprising cheaper metal such as a metal with a high melting point.

A multi-step HDPCVD process is performed on the substrate 200. The HDPCVD process comprises three steps. In a first step, a gas source is diverted into a deposition chamber to form a dielectric material 204, such as silicon oxide, over the substrate 200 and the conductive structures 202. The gas source comprises reactive gas, for depositing dielectric material and gases, such as argon or oxygen, for sputtering. Thus, the first step can simultaneously perform deposition and sputtering. The reactive gas comprises silane ($SiH_4$) and oxygen. Here, oxygen also plays a sputtering agent while not reacting with silane.

For the first step, it has a deposition associated with sputtering effect while depositing the dielectric material 204, however, the dielectric material 204 on one side of the top corners of the gaps is possibly sputtered and then redeposited on the opposite side of the gaps due to a reduced gap size. Like the overhang in PECVD, the re-deposited dielectric material may seal the gaps to form voids therein. If the gaps are closed with the voids therein, dielectric material can no longer be filled into the bottom of gaps. Thus, the first step is performed to form the dielectric material in the gaps until a thickness of the dielectric material 204 is about $\frac{1}{3}$–$\frac{1}{2}$ of a thickness of the height of the gaps.

Referring to FIG. 2B, a second step of the HDPCVD process is performed. The reactive gas, used for forming the dielectric material 204, is diverted out of the chamber for about 2–15 seconds by, for example, a pump. At the same time, argon and oxygen flow continuously providing the sputtering effect. Thus, a part of the dielectric material on top of corners of the dielectric 204 is removal.

Referring to FIG. 2C, a third step of the HDPCVD process is performed again to deposit dielectric material 206a, 206b on the dielectric layer 204a until well filling the gaps between the conductive structures 202.

The HDPCVD process of the invention comprises several parameters, such as silane divert delay time, low-frequency radio frequency power (LFRF), high-frequency radio frequency power (HFRF), and gas flow. Silane divert delay time associated with HFRF power is used to control the amount of dielectric material removed. The LFRF power is used to dissociate the reactive gas so as to form the dielectric material. The HFRF power, which is dominant the sputter effect, is used to apply a bias voltage to accelerating the ion bombardment speed. Thus, the larger the HFRF power, the faster the sputtering rate of HDPCVD. For the second step of the HDPCVD process, without deposition, the dielectric material will be removed, especially faster at corner faceting. The other parameters described above are fixed during the three steps of the HDPCVD process.

Furthermore, the invention uses one multi-step HDPCVD process to completely fill gaps. Most parameters of the HDPCVD process are fixed. Only the parameter of driverting silane flow need to be controlled, which depends on whither silane flow out or into the deposition chamber.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of filling a gap, wherein a semiconductor substrate having a plurality of conductive structures formed thereon and a plurality of gaps between the conductive structures to isolate the conductive structures, is provided, comprising the steps of:

performing a first step of a high density plasma chemical vapor deposition (HDPCVD) process to form a dielectric material on the conductive structures and within the gaps, wherein a gas source comprising silane ($SiH_4$) and oxygen and a sputtering gas are flowed into a deposition chamber for forming the dielectric material;

performing a second step of the HDPCVD process to provide an in-situ sputtering treatment in order to remove a part of the dielectric material deposited at top corners of the conductive structures, wherein silane is driven out of the deposition chamber by a pump to provide the in-situ sputtering treatment in the second step; and performing a third step of the HDPCVD process to continually deposit the dielectric material until the gaps are filled.

2. The method according to claim 1, wherein the dielectric material comprises silicon oxide.

3. The method according to claim 1, wherein the sputtering gas comprises argon.

4. The method according to claim 3, wherein argon and oxygen provide the sputtering treatment.

5. The method according to claim 1, wherein the second step is performed for 2–15 seconds.

6. The method according to claim 1, wherein a thickness of the dielectric material formed in the first step is about ⅓–½ of the thickness of the conductive structures.

7. A method of filling a gap, comprising the steps of:
   providing a substrate having a plurality of gaps therein; and
   performing a HDPCVD process using a reactive gas containing silane and oxygen to form a dielectric material over the substrate until a thickness of the dielectric material is about ⅓–½ of a height of the gaps, then removing a portion of the dielectric material at top corners of the gaps by removing silane from the reactive gas, and again forming the dielectric material, using the reactive gas containing silane and oxygen, to fill the gaps completely.

8. The method according to claim 7, wherein removing a portion of the dielectric material is performed for 2–15 seconds.

9. The method according to claim 7, wherein an insulating layer is on the substrate and the gaps are formed in the insulating layer.

10. The method according to claim 7, wherein a plurality of conductive structures are formed on the substrate and the gaps are located between the conductive structures.

* * * * *